United States Patent [19]

Satriano

[11] Patent Number: 5,038,197
[45] Date of Patent: Aug. 6, 1991

[54] HERMETICALLY SEALED DIE PACKAGE WITH FLOATING SOURCE

[75] Inventor: Robert J. Satriano, Hackettstown, N.J.

[73] Assignee: Harris Semiconductor Patents, Inc., Melbourne, Fla.

[21] Appl. No.: 545,218

[22] Filed: Jun. 26, 1990

[51] Int. Cl.[5] .................. H01L 23/02; H01L 23/12; H01L 23/42; H01L 39/02
[52] U.S. Cl. ........................... 357/74; 357/80; 357/79; 357/75
[58] Field of Search ............... 357/74, 70, 79, 80, 357/75

[56] References Cited

U.S. PATENT DOCUMENTS

| | | |
|---|---|---|
| 4,639,759 | 1/1987 | Neidig et al. .................. 357/74 |
| 4,694,322 | 9/1987 | Sakurai et al. ................. 357/74 |
| 4,739,449 | 4/1988 | Kaufman ....................... 357/74 |
| 4,879,633 | 11/1989 | Kaufman ....................... 357/70 |
| 4,907,067 | 3/1990 | Derryberry ..................... 357/74 |

Primary Examiner—Jerome Jackson, Jr.
Assistant Examiner—Carl Whitehead, Jr.
Attorney, Agent, or Firm—K. R. Glick

[57] ABSTRACT

An hermetically sealed package for a die comprised of a base plate, a side wall mounted on the brace plate, a printed circuit board connecting terminals on one side of the die to a first lead, connector clips connecting terminals on the other side of die to a bus having posts extending, wires connecting other terminals on the other side of the die to runners on the circuit board, leads respectively extending from each runner, a cover lid hermetically sealed to the side wall, the lid having openings hermetically sealed by insulators having slots through which the leads respectively extend in sealed relationship.

11 Claims, 7 Drawing Sheets

HERMETICALLY SEALED DIE PACKAGE WITH FLOATING SOURCE

FIELD OF THE INVENTION

This invention relates to a package for an electronic device, and more particularly to a package for hermetically sealing electronic devices and circuits.

BACKGROUND OF THE INVENTION

Electronic devices such as transistors and circuit interconnections therefore are often formed within ceramic material so as to create what is variously referred to as a chip, die or integrated circuit. The term die will be used herein. In many applications the die are subjected to wide changes in temperature or pressure and in others they are subjected to moisture. In order to reduce the adverse effects that such environmental conditions would have on operation, the die have been mounted within hermetically sealed packages that are designed to maintain the structural integrity of the die. It is also important that the package be designed so that the magnetic fields created by currents flowing in the circuit do not adversely affect its operation.

Because of the highly competitive nature of the die manufacturing business, it is very important that the package can be economically assembled, and because the die must be highly reliable, it is also important that they can be tested before the full expense of assembly has occurred.

Packages are generally designed in such manner as to easily accommodate only one die, so that if more die are to be used, an entirely different concept must be developed so as not to add significantly to the cost.

BRIEF SUMMARY OF THE INVENTION

In addition to being inexpensive and easy to test when only partly assembled, the die package of this invention provides stable operation when subjected to significant changes in pressure and/or temperature. Furthermore, the design is such that it can be used to accommodate any number of die.

Although the package of this invention can be used with die for widely different purposes, it is particularly advantageous when used with die containing power transistors that are to be operated in parallel.

The die has terminals on a first side, considered to be a bottom side, for electrodes that are to be connected together, and the terminals are mounted in electrical contact with a large land on a printed circuit board that has an upstanding lead connected to it. Thus, if the terminals are for drain electrodes, the upstanding lead is a drain lead.

Smaller lands on the board also have upstanding leads mounted on them and are respectively connected to runners extending along edges of the large land. Different sets of terminals that are located on the second side of the die, considered to be a top side, are respectively connected to the runners in a suitable manner such as by wire bonds. Thus, if one set of terminals is for gate electrodes, they are all connected to one runner, and the upstanding lead connected to the land for that runner is the gate lead. In a similar manner, the terminal for a sense electrode is connected to a different runner so that the upstanding lead connected to the land for that runner is the sense lead.

Also located on the second side of the die is another set of terminals for electrodes that are to be connected together. A bus is supported in spaced relation with the second side of the die by connectors between the bus and the terminals. Thus the bus may be said to be floating. An upstanding lead connected to one end of the bus will be a source lead if the terminals are for source electrodes. In this case, an upstanding Kelvin lead may be connected to the opposite side of the bus.

An advantage of this invention in positioning the drain and source leads together is the reduction of the magnetic effects associated with the currents for these terminals. Whereas the current for each electrode is small enough to have an insignificant magnetic field, the summation of these currents could produce a large magnetic field that would cause malfunctioning of the devices. In accordance with this invention, therefore, the currents from the terminals on the first side of the die are made to flow via spaced paths along the large land to a lead connected thereto and are not summed until they reach a point that is so far from the die as to have no significant adverse magnetic effect. Currents from the terminals on the second or top side of the die that flow through the connectors are summed when they reach the bus, but it is spaced from the die so that the summed currents have very little magnetic effect. The currents from the terminals connected by wire bonds to the runners are so small that they have insignificant magnetic effects.

Another advantage of the invention is the ease with which the package can be designed to accommodate any desired number of die. It is only necessary to make the large land on the printed circuit board have an area commensurate with the sum of the areas of the die.

Hermetically sealing the structure just described can be done in many ways, but in accordance with this invention the printed circuit board and die are mounted on an area of a base plate that is surrounded by a side wall having its bottom hermetically sealed to the base plate. A cover lid having at least one opening therein is hermetically sealed to the top of the side wall, and insulators having slots through which the various leads respectively extend seal the openings. The spaces between the leads and the slots are hermetically sealed with solder.

Testing of the operation of any die is done before the cover lid is attached to the side wall so as to reduce expense if a defect is found.

BRIEF DESCRIPTION OF THE DRAWINGS

The invention will be more fully understood from the following detailed description of preferred embodiments of the invention in conjunction with the drawings in which like items are identified by the same reference designation, wherein.

DETAILED DESCRIPTION OF THE INVENTION

Figure 1:
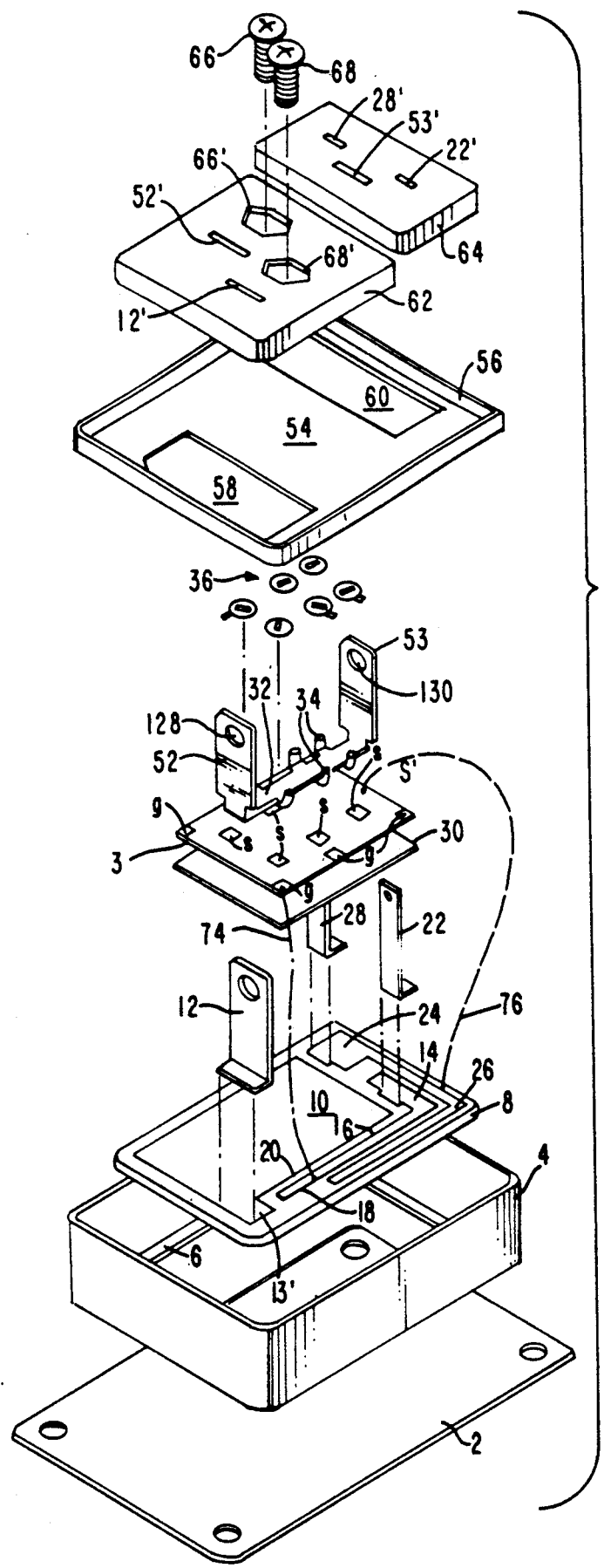
FIG. 1 is an exploded view of an embodiment of the invention having a single die.

As shown in FIG. 1, the package is built on a base plate 2 having holes at the corners thereof through which suitable means may be thrust so as to attach the package to a chassis. In order to reduce stress on the circuit board 8 in the presence of ambient temperature changes, the base plate 2 is preferably made of material such as molybdenum that has nearly the same coefficient of expansion with temperature as the ceramic material from which the circuit board 8 is made. After a closed side wall 4 of cold rolled steel is attached to the base plate 2 by brazing between the plate 2 and an inwardly extending flange 6 at the bottom of the wall, the base plate 2 and sidewall 4 are nickel plated.

A circuit board 8 made of beryllium oxide, clad on the top and bottom with copper, is brazed to the top surface of base plate 2 within the area provided by extending flange 6 and enclosed by the side wall 4. A large land 10 is formed in the copper surface on the top of the circuit board 8, and an upstanding nickel coated copper drain lead 12 is brazed on a projection 13' thereof. A small land 14 is formed adjacent an edge 16 of the land 10 and joined with a runner 18 that extends in spaced relationship along an edge 20 of the land 10, and a nickel coated upstanding copper gate lead 22 is brazed to the land 14. Another small land 24 is formed adjacent the edge 16 of the large land 10 and joined to a runner 26 that has portions parallel to the runner 18, and an upstanding nickel coated copper sense lead 28 is brazed to the land 24. A nickel coated molybdenum mounting pad 30 that fits within the land 10 is brazed to the land 10. In forming this subassembly the brazing is done prior to the nickel plating.

Attention is now directed to another subassembly including the ceramic die 3. Terminals s on the top of the die 3 are respectively connected to six source electrodes of power FET's included in the die 3. Also shown are terminals g for gate electrodes for the FET's and a terminal S' for a sensing area that is a known portion of the active area of the die 3. Terminals d for the drain electrodes of the FET's are not seen because they are on the underside of the die.

Figure 1A:
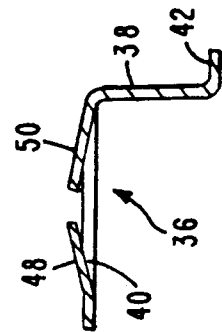
FIGS. 1A and 1B illustrate a connector clip used to contact the source pads on the top side of the die and the floating source bus.
Figure 1B:
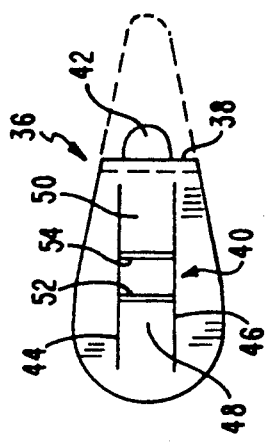

Also included in this subassembly is a bus 32 having upwardly extending posts 34 along either side. Conductor clips 36 are respectively pushed onto the posts 34, and their ends are respectively soldered to the source terminals s. As shown in FIGS. 1A and 1B, the conductor clips 36 are comprised of a central member 38 having arms 40 and 42 extending perpendicularly in opposite directions from the central member 38 (See FIG. 1A). Parallel slits 44 and 46 are cut in the arm 40 so as to form two flexible tabs 48 and 50 having opposed ends 52 and 54 that are spaced from each other. When the tabs 48 and 50 with opposed ends 52 and 54 are pushed down on a post 34, tabs 48 and 50 bite into post 34 thereby permanently positioning a conductor clip 36 onto an associated terminal s of die 3. The clips 36 can be made of copper and solder clad on the underside.

An upstanding source lead 52 is formed at one end of the bus 32, and, if desired, an upstanding Kelvin lead 53 is formed at the opposite end of the bus. The drain terminal on the underside of the die 3 is soldered to the mounting pad 30.

A cover lid 54 that may be made of nickel plated cold rolled steel is provided with a flange 56 that can be press fit into the top of the side wall 4 and hermetically sealed thereto by welding.

In this particular embodiment, the source lead 52 and the drain lead 12 extend through an opening 58 in the lid 54 and respectively pass through slots 52' and 12' in an insulator 62. The sense lead 28, the gate lead 22 and the Kelvin lead 53 extend through an opening 60 and respectively pass through slots 28', 22' and 53' in an insulator 64. The ends of the source lead 52 and the drain lead 12 are formed over hexagonal openings 66' and 68' of insulator 62. The screws 66 and 68 are threaded through hexagonal nuts, not shown, that are captured in hexagonal depressions 66' and 68' so as to permit firm external electrical connections to be easily made.

Figure 5:
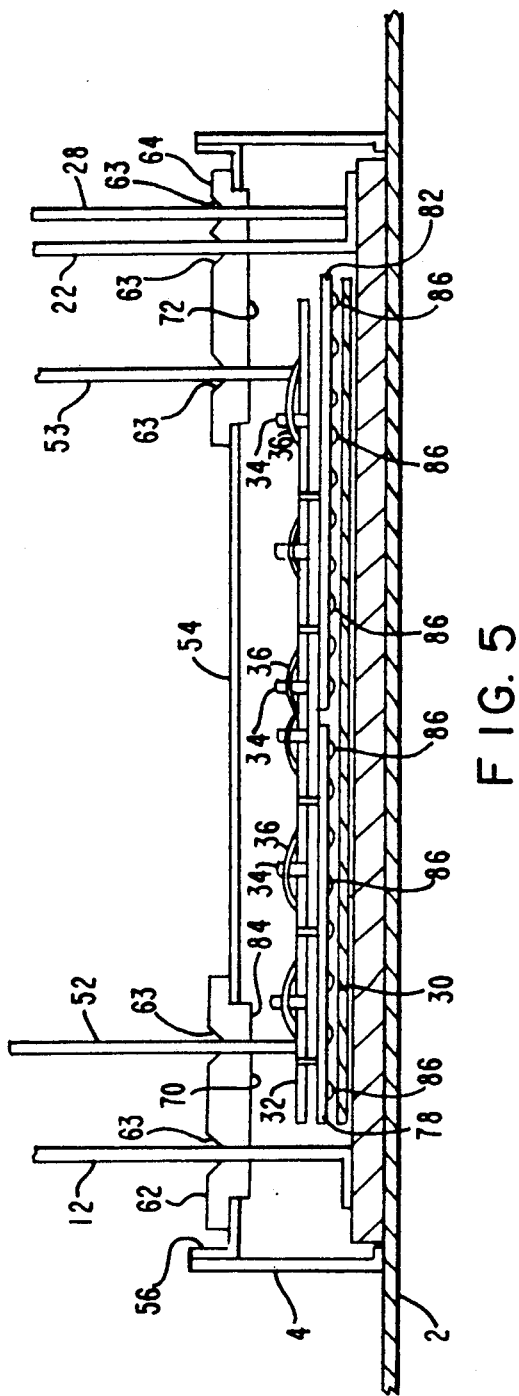
FIG. 5 is a cross section taken at 5,5 of FIG. 4.

The insulators 62 and 64 are hermetically sealed to the lid 54. For this purpose, lands 70 and 72, shown in FIG. 5, are provided on the bottoms of the insulators 62 and 64, respectively, that snugly fit into the openings 58 and 60 so that the tops of the insulators form flanges extending beyond the edges of the openings. The under sides of the flanges may be metalized with moly manganese and then nickel plated and soldered. As shown in FIG. 5, the top edges of the slots are chamfered, and the slots are metallized with moly manganese and nickel plated before being soldered.

Electrical connections between gate terminals g that are on the top or second side of the die 3 and the gate lead 22 may be made by aluminum bonding wires extending from each gate terminal to the runner 18, but in the interest of simplicity only the wire 74 is shown. The sense terminal S is connected in the same manner by a wire 76 to the runner 26.

Figure 2:
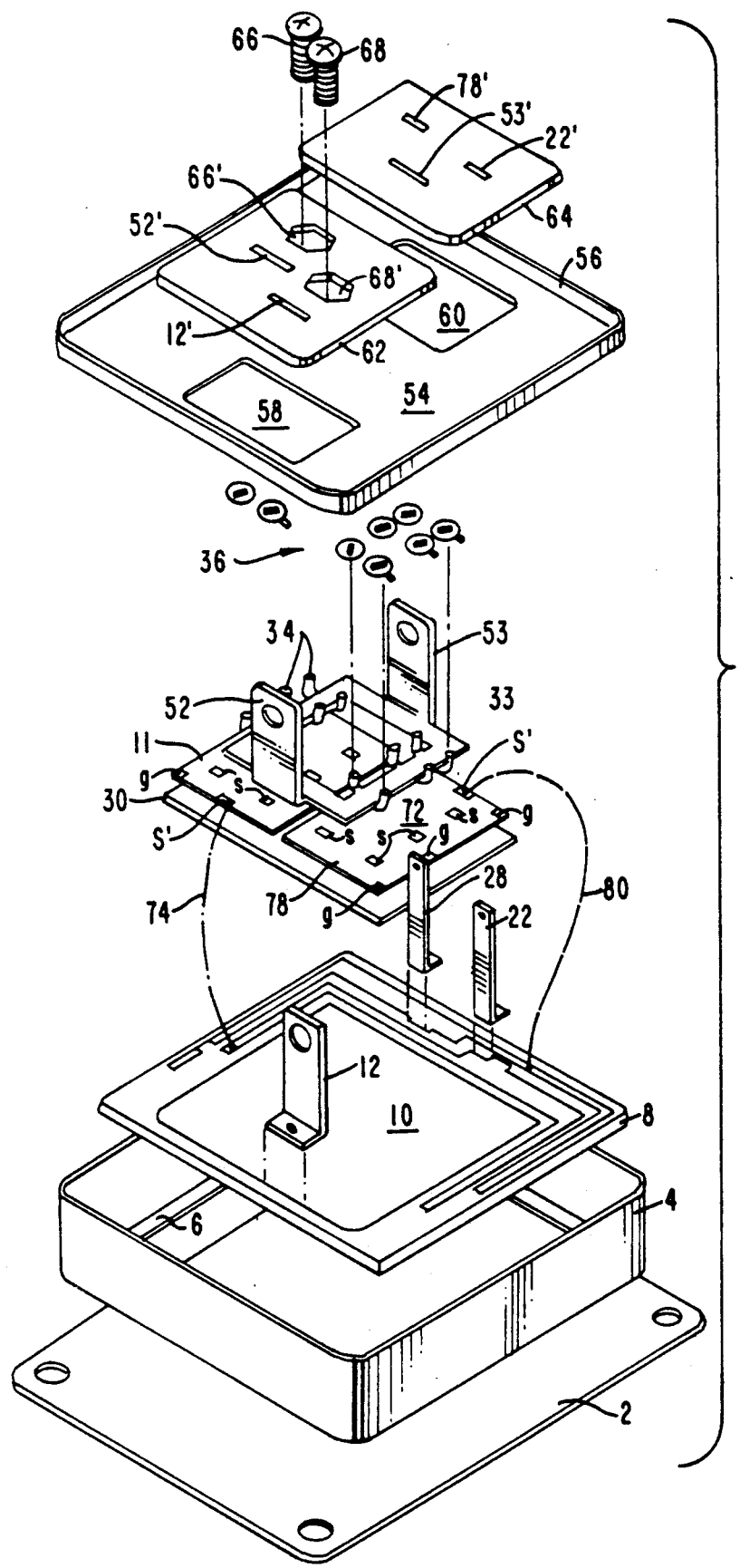
FIG. 2 is an exploded view of an embodiment of the invention having two die.

FIG. 2 is an exploded view illustrating an embodiment of the invention having two die, 11 and 78. The land 10 and the mounting pad 30 are large enough to accommodate both die so that all of their drain terminals are connected to the drain lead 12. Each die has a sense terminal that is connected to the runner 26 by aluminum wire bonding indicated at 74 and 80. Note that the bus 33 is made of four arms forming a rectangle.

Figure 3:
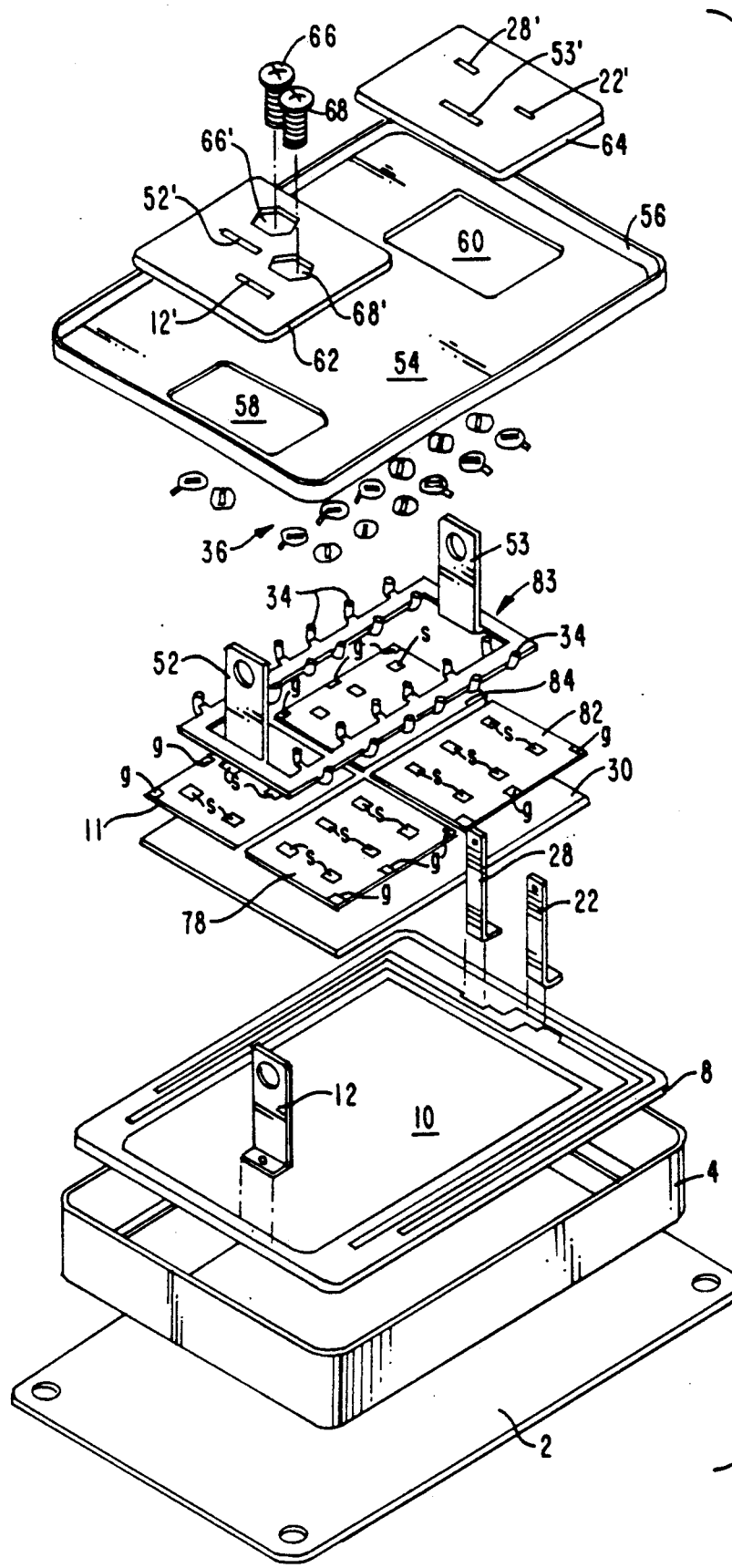
FIG. 3 is an exploded view of an embodiment of the invention having four die.

FIG. 3 is an exploded view illustrating an embodiment of the invention having die 12, 78, 82 and 84. In order to avoid confusion, the bonded aluminum wires for the gate and sense terminals are not shown. The mounting pad 30 and the land 10 are large enough to accommodate all four die.

Figure 4:
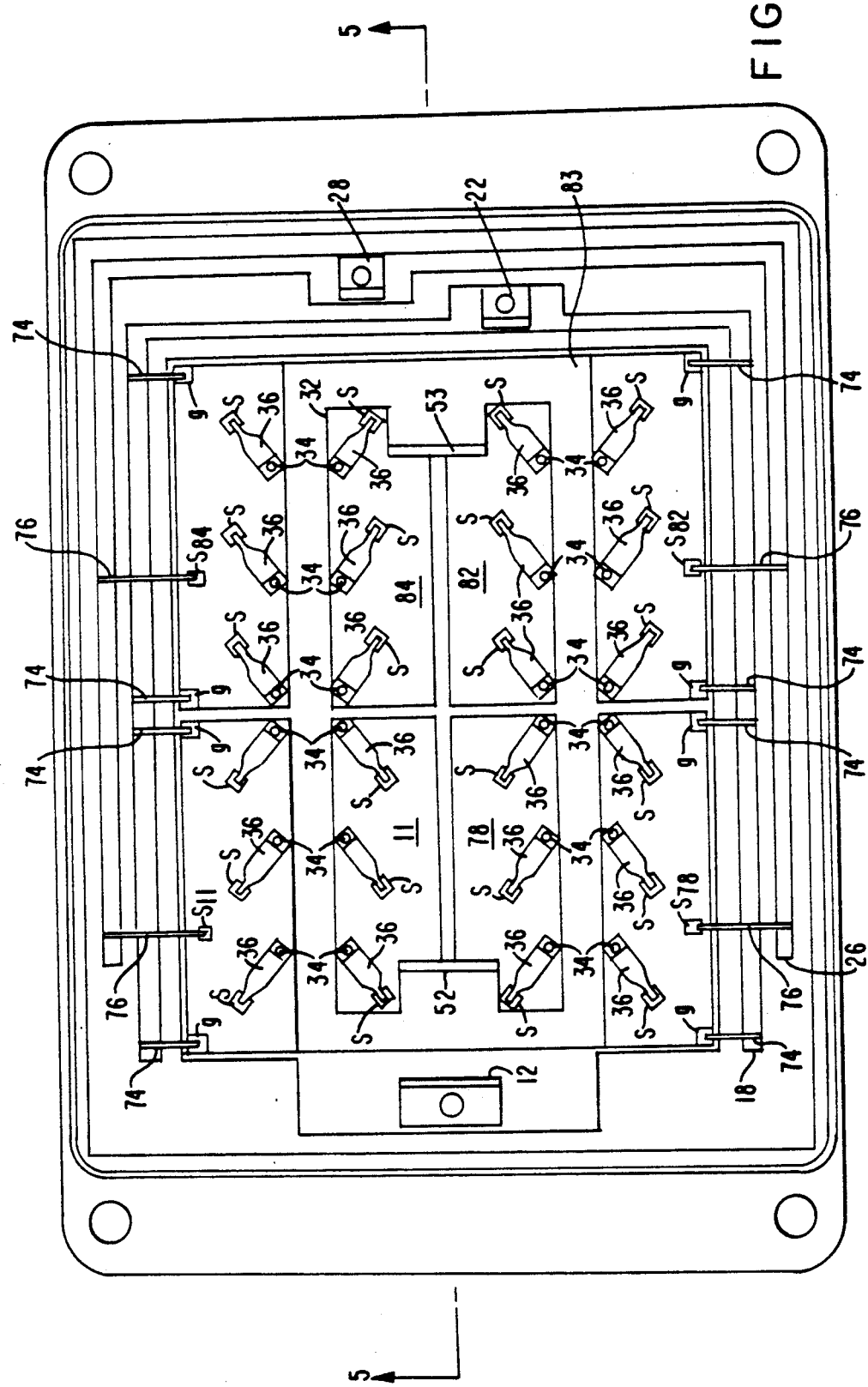
FIG. 4 is a top view of an assembly without its cover lid.

FIG. 4 is a top view of the four die assembly illustrated in FIG. 3 with the cover lid 54 removed. Note that the die 11, 78, 82 and 84 respectively have single sense terminals $S_{11}$, $S_{78}$, $S_{82}$, and $S_{84}$ that are respectively connected to the runner 26 for the sense lead 28 and that all gate terminals g are connected by wires to the runner 18. The connector clips 36, respectively, connect the source terminals s to the posts 34 on the bus 83.

FIG. 5 is a cross section of FIG. 4 taken at 5,5 but adding the cover lid 54 and the insulators 62 and 64. Note, the lands 70 and 72 on the undersides of the insulators 62 and 64, and the chamfers 63 in the insulators 62 and 64 around each of the slots for the leads. Also shown, but with exaggerated height, are the drain terminals 86 on the underside of the die 78 and 82 that are connected by the mounting pad 30 and the land 10 to the drain lead 12.

ASSEMBLING THE PACKAGE

The steps by which a die package of this invention may be assembled and tested are set forth below. At an appropriate point, reference is made to FIGS. 6 and 7 illustrating a fixture for retaining various components of the assembly in desired relative positions.

1. Braze the side wall 4 to the base plate 2.
2. Braze the copper drain lead 12, the copper gate lead 22 and the copper sense lead 28 to the lands 13, 14 and 24 respectively of the circuit board 8.
3. Braze mounting pad 30 to large land 10.
4. Braze circuit board to base plate 2.
5. Nickel plate the subassembly formed at end of step 4.
6. The copper bus 32, source lead 12 and Kelvin lead 22 are nickel plated.
7. Place solder clad copper clips 36 in posts 34, forcing them into firm contact with the bus 32.

Figure 6:
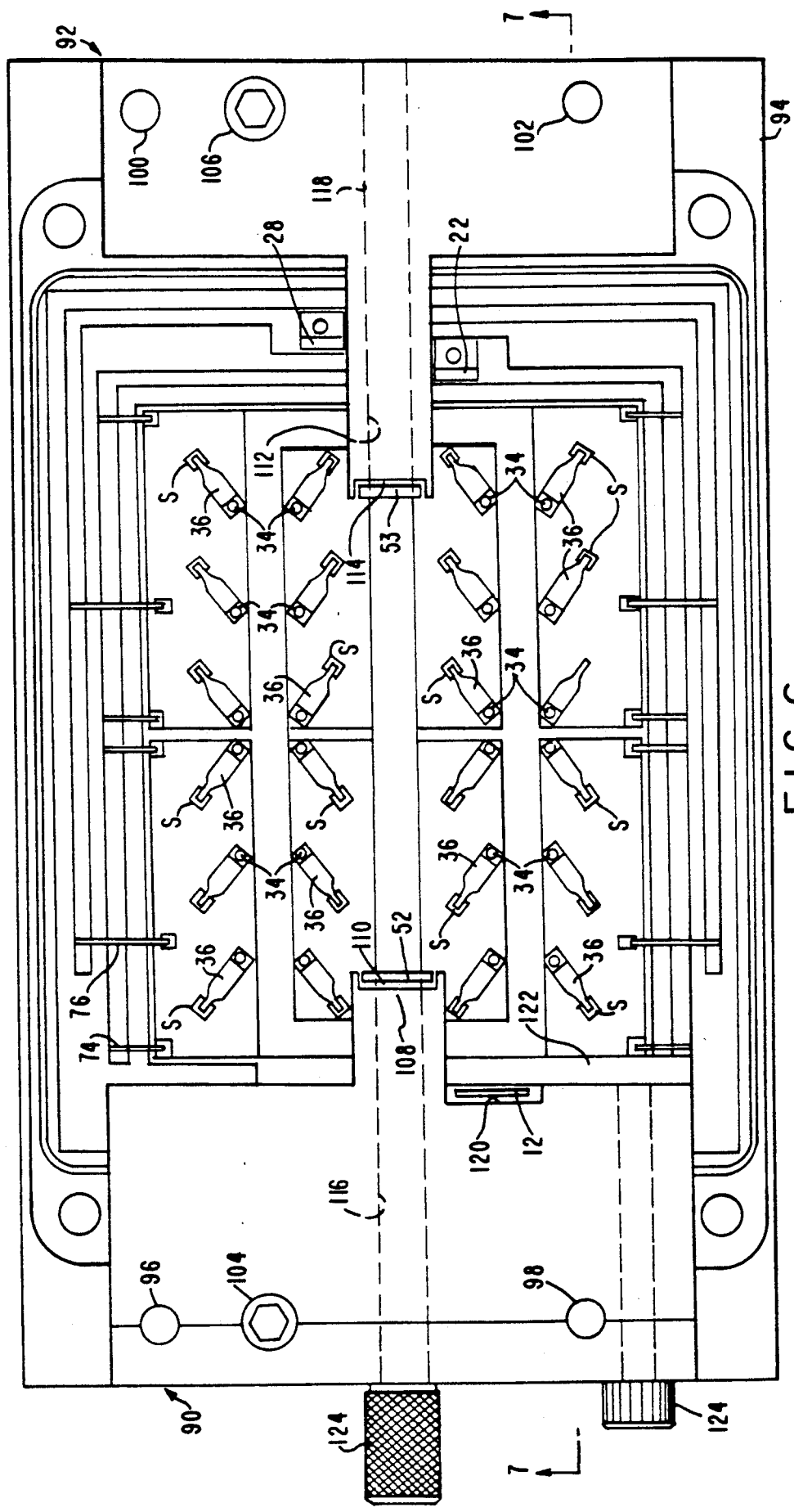
FIG. 6 is a top view of a fixture used in assembly.
Figure 7:
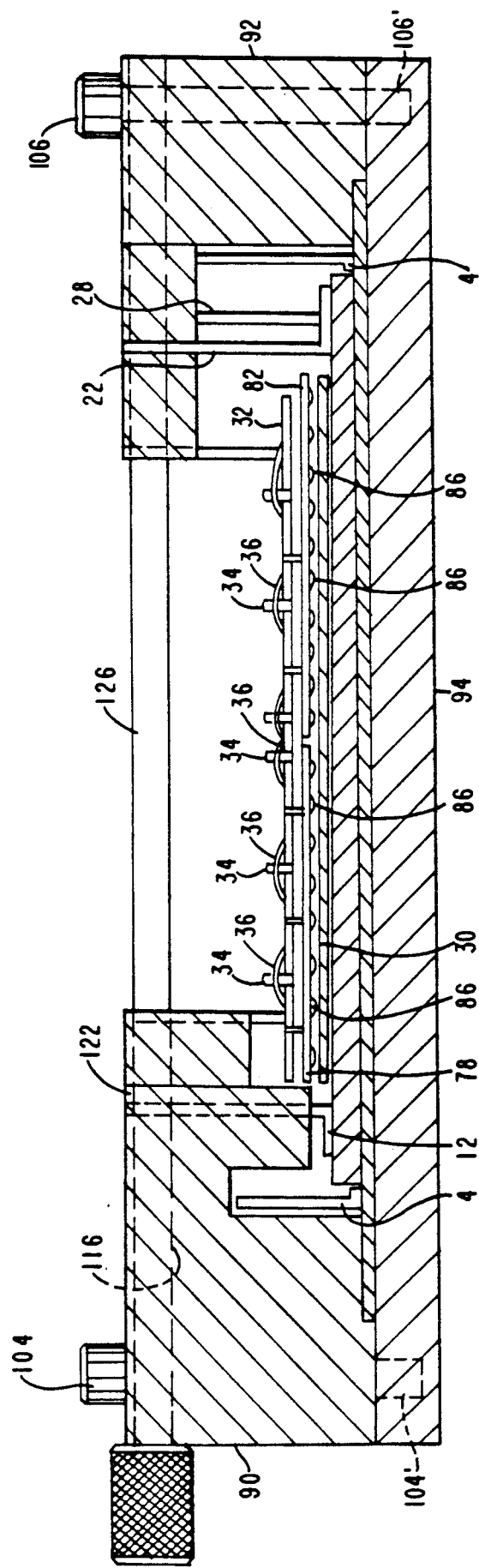
FIG. 7 is a section of FIG. 6 taken at 7,7.

Reference is now made to the assembly fixture shown in FIGS. 6 and 7. It is comprised of three basic parts, a source lead support 90, a Kelvin lead support 92 and a base plate 94. The source lead support 90 has downwardly extending locating pins, not shown, at points 96 and 98 that are to be placed into locating holes, not shown, in the base plate 94. The Kelvin lead support 92 has downwardly extending locating pins, not shown, at points 100 and 102 that are to be placed into locating holes, not shown, in the base plate 94. Screws 104 and 106 respectively pass vertically through the supports 90 and 92 screw into threaded holes 104' and 106' in the base plate 94 so as to hold the assembly together when it has been assembled.

A central projection 108 of the source lead support 90, has a vertical groove 110 at the end thereof dimensioned to fit closely to three sides of a source lead 52 when placed therein, and a central projection 112 of the Kelvin lead support 92 has a vertical groove 114 at the end thereof dimensioned to fit closely to three sides of a Kelvin lead when placed therein. A horizontal cylindrical passageway 116 is formed in the source lead support 90 that extends through the projection 108, and a horizontal cylindrical passageway 118 is formed in the Kelvin lead support 92 that extends through the projection 112. The passageways 116 and 118 are aligned.

As shown in the cross sectional view of FIG. 7, the undersides of the source lead support 90 and of the Kelvin lead support 92 are provided with spaces at right angles to the passageways 116 and 118 into which the left and right portions of the side wall 4 can be placed. A vertical channel 120 is formed in the source lead support 90 adjacent projection 108 in the position that the drain lead 12 is to have, and a plate 122 covers the channel 120 so as to form a passageway. The plate 122 is held in position by a thumb screw 124 passing through a passageway in the source lead support 90 and having its end screwed into a tapped hole in the plate 122. Return now to the assembly procedure.

10. The subassembly of the base plate 12, the side wall 4, the printed circuit board 8, the drain lead 12, the sense lead 28, the gate lead 22 and the mounting pad 30 are mounted in the fixture assembly as follows. The subassembly is placed on the base plate 94 of the assembly fixture of FIGS. 6 and 7. Then the source lead support 90 is lowered onto the base plate 94 so that the drain lead 12 extends through the passageway formed by the channel 120 and the plate 122 in such a manner that the source lead 52 lies in the channel 110 at the end of the projection 108. The locating pins of the source lead support 90 are then positioned in the locating holes in the base plate 94. At this point, the Kelvin lead support 92 is placed onto the base plate 94 so that the Kelvin lead 53 is aligned in the groove 114 at the end of the projection 112 and its locating pins are in the locating holes in the base plate 94. Final location of the subassembly within the assembly fixture is made by passing a locating pin 126 through the passageway 116 in the source lead support 90, a hole 128 at the end of the source lead 52, a hole 130 at the end of the Kelvin lead 53 and the passageway 118. The screws 104 and 106 are then screwed into the base plate 94.

11. The connector clips 36 are then rotated until their ends 42 are on the respective source terminals, and the clips are soldered to the terminals and the posts 34.

12. The wire bonds are made between any sense terminals S in the die 30 and the runner 26, and wire bonds are made between any gate terminals on the die 30 and the runner 18.

13. Electrical tests are made.

14. The cover lid 54 is then press fit into the top of the side wall 4.

15. The insulators 62 and 64 are positioned in the openings 58 and 60 with the leads extending through the apertures therein.

16. The assembly is placed in a furnace to reflow solder.

17. The assembly is subjected to a vacuum bake for outgassing.

18. The cover lid 54 is then welded to the side wall 4.

The various embodiments of the invention have been described herein for purposes of illustration are not meant to be limiting. Modifications to these embodiments may occur to those of skill in the art, which modifications are meant to be covered by the spirit and scope of the appended claims.

What is claimed is:

1. An assembly for connecting leads to terminals of a die comprising:
   a printed circuit board having a plurality of separate conductive areas thereon;
   a die containing a plurality of electronic elements and having a plurality of terminals on a first side thereof and a plurality of terminals on a second side thereof;
   means for connecting the terminals on the first side of said die to one of said conductive areas on said circuit board;
   a first lead mounted on said one conductive area;
   conductive means respectively connecting selected terminals on the second side of said die to other conductive areas on said printed circuit board;
   leads respectively connected to said other conductive areas on said circuit board;
   a bus having at least one lead extending therefrom; and
   conductors for both electrically connecting a number of like terminals on the second side of said die to said bus, and supporting said bus a predetermined distance away from said die.

2. An assembly as set forth in claim 1 wherein said means for connecting the terminals on the first side of said die is comprised of a conductive mounting pad having one side in contact with the terminals on said first side of said die and its other side in contact with said one conductive area on said circuit board.

3. An assembly as set forth in claim 2 further comprising:
   a base plate,
   a continuous side wall having its bottom hermetically sealed to said base plate;

said printed circuit board being mounted adjacent said base plate and within said side wall;

a cover lid sealed to the top of said side wall;

means defining at least one opening in said cover lid, each opening having a periphery;

insulators mounted in said cover lid so as to form seals around the periphery of each opening;

means defining slots in said insulators;

said leads respectively extending through said slots; and means forming hermetic seals between said leads and said slots.

4. An assembly as set forth in claim 3 wherein said base plate and said mounting pad are made from molybdenum so as to have a temperature expansion coefficient that is very close to the expansion coefficient of said die.

5. An assembly as set forth in claim 4 wherein
said leads are made from nickel clad copper; and
said side wall and cover lid are made from nickel plated cold rolled steel.

6. An assembly as set forth in claim 5 wherein:
said leads are brazed to the respective conductive surfaces on said printed circuit board.

7. An assembly as set forth in claim 2 wherein:
said electronic elements contained within said die are power transistors having drain electrodes connected to the terminals on the first or bottom side of said die, source electrodes connected to the terminals on the second or top side of said die that are connected to said bus via said conductors and gate electrodes respectively connected to said conductive means.

8. An assembly as set forth in claim 2 further comprising:
at least one additional die having terminals on first and second sides thereof, said terminals on said first side being connected to said first lead, said terminals on said second side being connected to other conductive areas on said printed circuit board and said bus in the same respective manner as the terminals on said first mentioned die.

9. An assembly as set forth in claim 2 wherein:
one of the terminals on the second side of said die is a test terminal for said die, and
a sense lead is connected to the conductive area on said circuit board to which said test terminal is connected.

10. An assembly as set forth in claim 2 further comprising:
a Kelvin lead connected to a different point on said bus.

11. A package for at least one power device, comprising:
a base plate;
a side wall sealingly mounted on said base plate that encloses a given area thereof;
a printed circuit board mounted on said base plate within said given area;
a die having a plurality of power FET's, the drain electrodes of said FET's being accessible on a first side of said die and the source and gate electrodes being accessible on a second side of said die;
a sense electrode for the die also being accessible on said second side of said die;
a drain lead mounted on said printed circuit board so as to project in a given direction from one side thereof;
a conductive pad located between said first side of said die and said printed circuit board for electrically connecting said drain electrodes to said drain lead;
a bus;
a plurality of clip means both electrically connecting said bus to individual ones of said source electrodes, respectively, on the second side of said die, and spacing said bus away from said die;
a source lead connected to said bus at a first point so as to project in said given direction;
a lead connected to said bus at a second point that is remote from said first point so as to project in said given direction;
a gate runner formed on said printed circuit board;
wire bonds respectively connecting the gate electrodes on the second side of said die to said gate runner;
a gate lead mounted on said gate runner so as to project in said given direction from said one side of said printed circuit board;
a sense lead mounted on said one side of said printed circuit board;
a wire connecting said source electrode to said sense lead;
a cover lid mounted on said side wall so as to form an hermetic seal therewith;
means defining at least one opening in said cover lid;
a ceramic insulator mounted in each opening so as to hermetically seal said opening;
means defining slots in each insulator in registration with said leads, said leads respectively passing through said slots; and
means hermetically sealing said leads in their respective slots.

* * * * *